United States Patent [19]
Carr

[11] Patent Number: 5,552,706
[45] Date of Patent: Sep. 3, 1996

[54] MAGNETORESISTIVE MAGNETIC FIELD SENSOR DIVIDED INTO A PLURALITY OF SUBELEMENTS WHICH ARE ARRAYED SPATIALLY IN SERIES BUT ARE CONNECTED ELECTRICALLY IN PARALLEL

[75] Inventor: Thomas D. Carr, Leucadia, Calif.

[73] Assignee: Eastman Kodak Company, Rochester, N.Y.

[21] Appl. No.: 430,707

[22] Filed: Apr. 27, 1995

Related U.S. Application Data

[63] Continuation of Ser. No. 997,850, Dec. 29, 1992.

[51] Int. Cl.[6] .......................... G01R 33/09; G11B 5/39
[52] U.S. Cl. .................. 324/252; 360/113; 338/32 R
[58] Field of Search .......................... 324/207.21, 249, 324/252; 338/32 R; 360/113, 110

[56] References Cited

U.S. PATENT DOCUMENTS

| | | | |
|---|---|---|---|
| 3,860,965 | 1/1975 | Voegelli | 360/113 |
| 3,879,760 | 4/1975 | Lazzari | 360/113 |
| 3,887,944 | 6/1975 | Bajorek et al. | 360/113 |
| 3,928,836 | 12/1975 | Makino et al. | 338/32 R |
| 3,967,368 | 7/1976 | Brock et al. | 360/113 X |
| 4,012,781 | 3/1977 | Lin | 360/113 |
| 4,535,375 | 8/1985 | Mowry et al. | 324/252 X |
| 4,660,113 | 4/1987 | Nomura et al. | 360/113 |
| 4,663,683 | 5/1987 | Youda et al. | 338/32 R X |
| 4,686,472 | 8/1987 | Van Ooijen et al. | 338/32 R |
| 4,851,944 | 7/1989 | Mowry | 360/113 |
| 4,853,633 | 8/1989 | Matsumoto | 324/252 |
| 4,879,610 | 11/1989 | Jove et al. | 360/113 |
| 5,079,663 | 1/1992 | Ju et al. | 360/113 |
| 5,155,643 | 10/1992 | Jones, Jr. et al. | 360/113 |
| 5,216,561 | 6/1993 | Jagielinski | 360/113 |

*Primary Examiner*—Sandra L. O'Shea
*Assistant Examiner*—Jay M. Patidar
*Attorney, Agent, or Firm*—William F. Noval

[57] ABSTRACT

A magnetoresistive magnetic field sensor with a very long active region and a transduction signal of adequate power is achieved without the need to substantially increase voltage or current densities. The sensor is subdivided into multiple sub-elements which are connected in parallel. The transduction signal is produced from the sum of the changes in voltage across each of the sub-elements.

9 Claims, 4 Drawing Sheets

MAGNETORESISTIVE MAGNETIC FIELD SENSOR DIVIDED INTO A PLURALITY OF SUBELEMENTS WHICH ARE ARRAYED SPATIALLY IN SERIES BUT ARE CONNECTED ELECTRICALLY IN PARALLEL

This is a continuation of application Ser. No. 997,850, filed 29 Dec. 1992.

FIELD OF THE INVENTION

This invention relates to the design of a magnetoresistive (MR) magnetic field sensor, and more particularly, to the design of a MR sensor with a very long active region.

DESCRIPTION OF THE RELATED ART

A magnetoresistive apparatus for detecting magnetic signals recorded on a magnetic medium is well known. Such apparatus is typically adapted from a ferromagnetic element deposited in the presence of a magnetic field with the effect of inducing anisotropy along the long (longitudinal) dimension of the element. Electrical contacts are typically placed at each end of such MR element, and current densities in the order of $1 \times 10^7$ A/cm$^2$ are applied across the MR element. In operation, a magnetic bias means is applied in order to rotate the angle of magnetization, $\theta$, away from the long (longitudinal) axis and towards the vertical. When an MR element biased in this manner is placed near magnetic fields emanating from magnetic media or other sources, interaction between the sensed magnetic field and the MR bias magnetic field causes the angle of magnetization, $\theta$, to shift around its stationary bias angle. As this angle of magnetization, $\theta$, shifts, the electrical resistance of the MR element varies. Thus, when a constant voltage is applied to the MR element, a suitable detector of changes in current constitutes a means of transducing the sensed magnetic field. Alternatively, when a constant current is applied to the MR element, a suitable detector of changes in voltage constitutes such a transduction means.

In a typical MR reproduce head, the length of the active region of a typical MR element nominally corresponds to the trackwidth of the recorded data. Since the trend in data reproduce applications is to require an ever increasing density of data, trackwidths have tended to become narrower over time. This narrowing, in turn, has required shorter and shorter MR elements. It is thus not surprising that little or no consideration has been given to the problems associated with MR elements made much larger than lengths now required to span typical data trackwidths.

Although MR reproduce heads are usually associated with data transduction functions, the inherent features of MR sensors make them suitable for a wide range of applications independent of transduction of magnetically recorded data. Among the inherent features are: high sensitivity to small magnetic fields, relatively simple circuitry, ease of fabrication, and ruggedness. Among the functions not directly related to transduction of magnetic data are: detection of magnetic fields (magnetometers), encoders for detecting shaft angles, currency detectors, magnetic material detectors, and credit card readers.

As can be observed, some of the above functions require larger rather than smaller active regions of MR elements. In particular, an MR element used as a portion of a currency detector apparatus would require an active region at least as long as the magnetic area of the currency being surveyed. For an American dollar, this trackwidth may exceed 0.4 inches.

Many variations from the above described design of a typical MR reproduce head apparatus are possible. Among the variations are those which have subdivided the length of the MR element in order to achieve various advantages. See for instance, U.S. Pat. No. 4,851,944 issued in the name of Mowry wherein a single non-biased MR element was divided into separately sensed active regions in order to span multiple tracks; U.S. application Ser. No. 892,873, now abandoned in the name of Jeffers wherein a center-tapped dual MR head permits circuitry for the elimination of second harmonic distortion; U.S. application Ser. No. 751,842, now U.S. Pat. No. 5,276,561, in the name of Jagielinski wherein a center tap and specialized circuits enable suppression of medium-induced playback errors; and U.S. Pat. No. 5,079,663 issued in the name of Ju wherein a center-tapped MR head coupled with sum and difference amplifiers enable improved servo tracking operation. In none of these variations are there any teachings or anticipation of the physical and electrical limits placed on the length of the active region of an MR element. Only in Mowry is there disclosure of an MR element subdivided into more than two sub-elements. Mowry's structure and function, however, are directed away from solving the problems associated with very long active regions of an MR element and towards a multiplicity of short independent active regions.

As discussed above, MR heads typically operate with current densities approximating $1 \times 10^7$ A/cm$^2$ over the active region of the MR element. This current density is a practical compromise between the desire to limit overall power requirements and the need to maintain sufficient current density to produce a useful signal. However, maintaining sufficient current densities over long MR elements becomes increasingly difficult as length increases since the MR element is an electrical resistor. One alternative is to increase voltage. However, use of large voltages across MR elements requires a more expensive power supply, increases the likelihood of electrical shorts (including arcs) which interrupt the transduction signal and risk destruction of the MR apparatus, and poses hazards to humans and equipment when working with such circuits. High current densities also tend to degrade the system due to electromigration of atoms into the interface regions between materials (such as the interface between electrical contacts and ferromagnetic material). Conversely, if voltage levels are kept within normal limits, the current through the MR elements becomes too small over long MR elements to produce a useful signal. In practice, experience has shown that the maximum useful length of a typical MR element (e.g. 400 Å thick and 20 $\mu$ high) operating under a voltage of 25 V and current density of $1 \times 10^7$ A/cm$^2$ is approximately 1000 $\mu$. For trackwidths longer than this length, higher voltages (with the problems described above) would normally be required.

A need has been felt to design an MR sensor with a very long active trackwidth which nevertheless produces a transduction signal of adequate voltage without the need for substantial increases in voltage.

SUMMARY OF THE INVENTION

It is an object to provide an improved MR element. It is a feature of this invention to provide a means of maintaining long active regions over a single MR element without the need to apply large voltages as would have been required under related art.

In order to resolve the above problem, the MR sensor of the invention is fabricated with a series of electrical contacts along the length of the MR element, thereby dividing the MR elements into a series of sub-elements. A common electrical circuit then connects each of these sub-elements in parallel and supplies each sub-element with an electrical bias of a constant voltage. When sensed magnetic fields interact with the various MR sub-elements, the transduction signal is extracted from the sum of the individual current changes across the sub-elements. For n sub-elements, the bias voltage required across any portion of the MR element using this invention is thereby reduced by 1/n when compared to a conventional MR sensor of the same length. This reduction is accomplished with no significant loss of signal.

Features and advantages of the invention include the following:

An advantage is that bias voltages can be reduced by 1/n, where n is the number of sub-elements, while maintaining reasonable current densities across the active region of a long MR element. This reduced voltage has the further advantage of permitting use of lower voltage and, therefore, less expensive power supplies which otherwise would need to be used with the MR sensor. Similarly, reduced voltage across the MR element and in the circuit connected to the MR element reduces the chances of shorts or of destructive electrical arcing. Reduced voltage also renders the MR sensor and associated circuits less hazardous to humans and equipment which may come in contact with the system.

DESCRIPTION OF THE PREFERRED EMBODIMENTS

Figure 1:
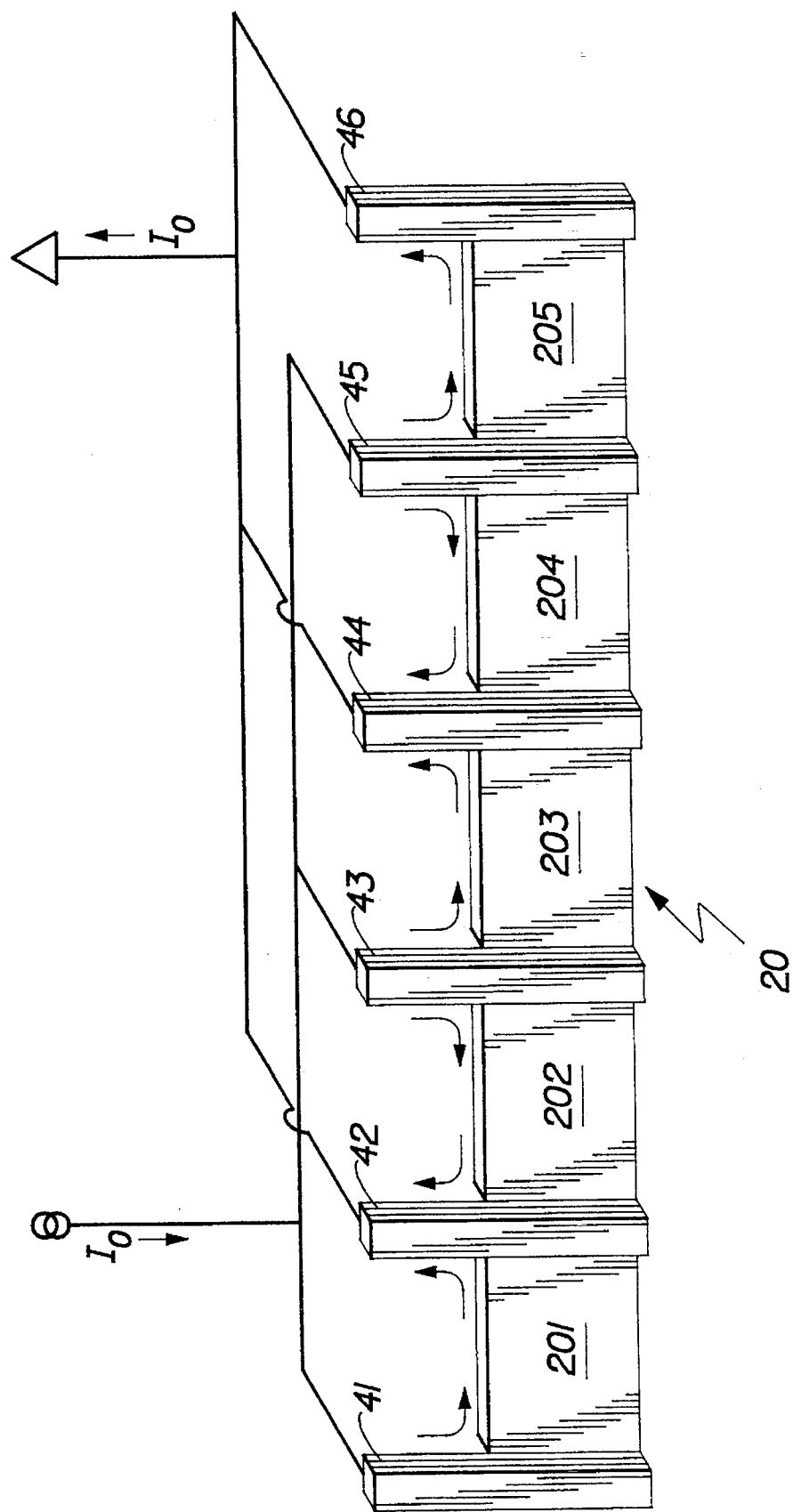
FIG. 1 depicts the design of the magnetoresistive element subdivided into sub-elements together with the basic electrical wiring connecting the sub-elements in parallel.

In accordance with the invention and referring to FIG. 1, a magnetic field sensing apparatus consists in part of at least one MR element 20, made of an electrically conductive, magnetically permeable, and magnetoresistive material such as Permalloy. The MR element 20 is masked and deposited using conventional means as a strip on a substrate (not shown) consisting of suitable insulating material such as $SiO_2$ or $Al_2O_3$. A typical thickness of such MR element 20 is 400 Å, and a typical MR element height is 20 μ. In accordance with this invention, MR elements 20 as long as 10,000 μ have been built and tested, and much longer lengths appear easily feasible. Such lengths are far in excess of the approximately 1000 μ practical limit to the length of a conventional MR sensor. An active region length of 1 cm is chosen as an example in order to simplify description of this invention. Current is conducted to and from such MR element 20 by electrical contacts 41–46 made of gold, silver or similar conductive metals which are deposited at regular intervals along MR element 20.

In a conventional MR head, only the two end contacts 41 and 46, are typically deposited. If the resistivity, ρ, of MR element 20 is measured at 25 μΩ-cm (a typical measurement), then the resistance ($R_{MR}$) as measured between contact 41 and contact 46 would be as follows:

$$R_{MR} = \frac{25 \times 10^{-6} \, \Omega \, cm \times 1 \, cm}{2 \times 10^{-3} \, cm \times 4 \times 10^{-6} \, cm}$$

To achieve maximum transduction signal across MR element 20, a bias current density of $5 \times 10^6$ A/cm² is optimally applied in order to electrically bias MR element 20. However, in order to sustain such a current density over the 1 cm active region of MR element 20, the following bias voltage ($V_{bias}$) would need to be applied in a conventional MR head:

$$V_{bias} = 3125 \, V \times 5 \times 10^6 \left( \frac{A}{cm^2} \right) 2 \times 10^{-3} \times 4 \times 10^{-6} = 125 \, V$$

As discussed in the preceding section, such high bias voltage requires a more expensive power supply, increases the probability of electrical shorting (including destructive arcing), and creates safety hazards to humans and equipment when working with such circuits.

Instead of the conventional configuration as described above, it is a feature of this invention to deposit middle contacts in addition to the conventional end contacts 41 and 46. Any number of middle contacts may be deposited. For purposes of this specification and again referring to FIG. 1, four middle contacts 42–45 are shown with the effect of dividing MR element 20 into five sub-elements, 201–205. In a preferred embodiment, current is conducted in the manner indicated in FIG. 1, with current flowing into MR element 20 through every other contact (i.e., 41, 43, 45) and out of MR element 20 through the alternating contacts (i.e., 42, 44, 46). In this manner, MR element 20 is electrically divided into its five sub-elements, 201–205. Assuming current densities remain at the desired $5 \times 10^6$ A/cm² as described above and assuming resistance, ρ, between contact 41 and 46 remains at 25 μΩ-cm, the voltage $V_{sub}$ through each of the MR sub-elements 201–205 is as follows:

$$V_{SUB} = \frac{125 \, V}{5} = 25 \, V$$

Thus, assuming equal length sub-elements, the effect of this invention is to reduce voltage across any portion of the active region of an MR element by 1/n, where n equals the number of sub-elements into which the MR element is divided.

Figure 2:
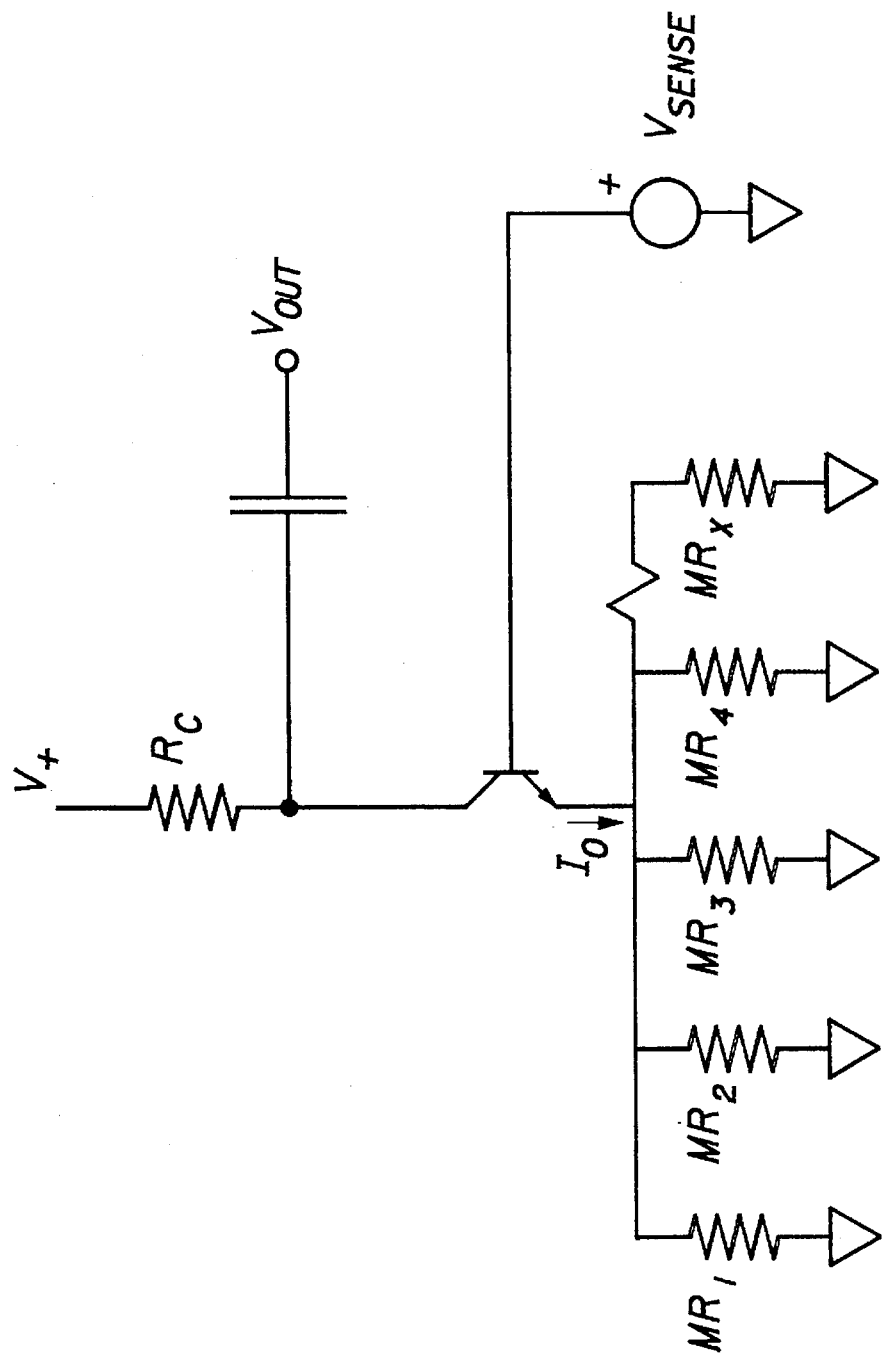
FIG. 2 is a circuit diagram of a simple MR apparatus which connects multiple sub-elements with one transistor in order to achieve a circuit with both bias current and signal gain according to the present invention.
Figure 3:
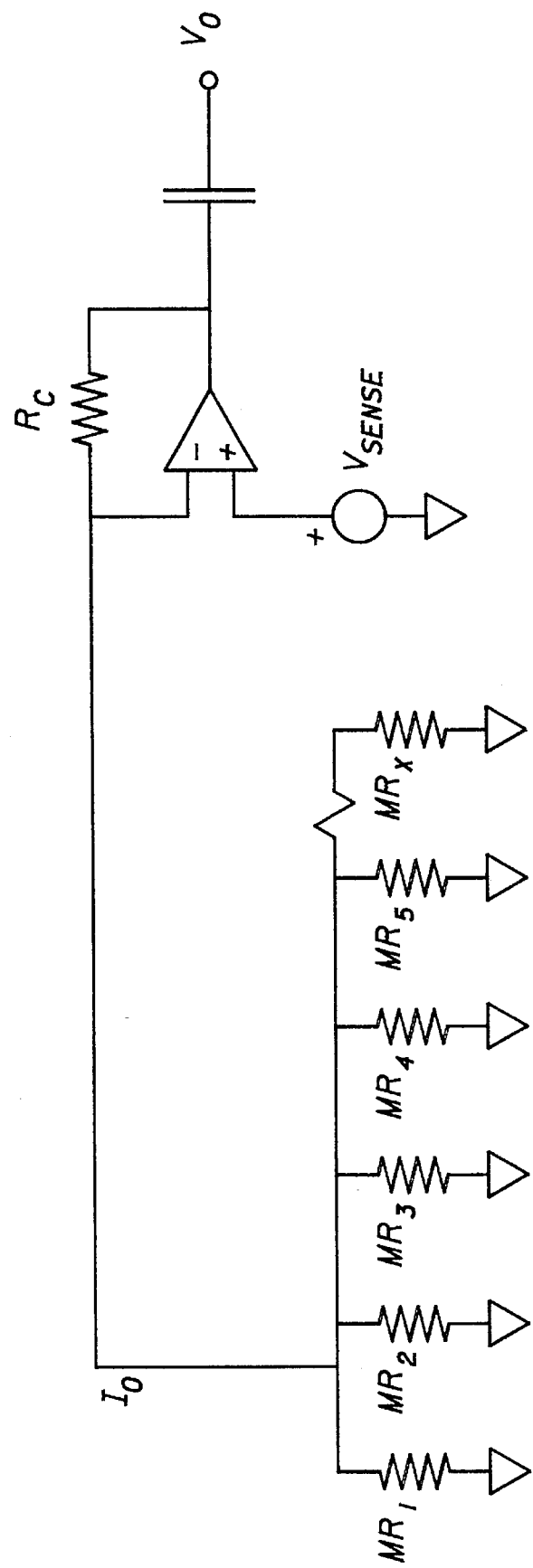
FIG. 3 is a circuit diagram of a MR apparatus which uses multiple sub-elements in conjunction with an operational amplifier in order to maintain constant gain at all sense currents as well as elimination of the collector-to-emitter voltage ($V_{ce}$) of FIG. 2.
Figure 4:
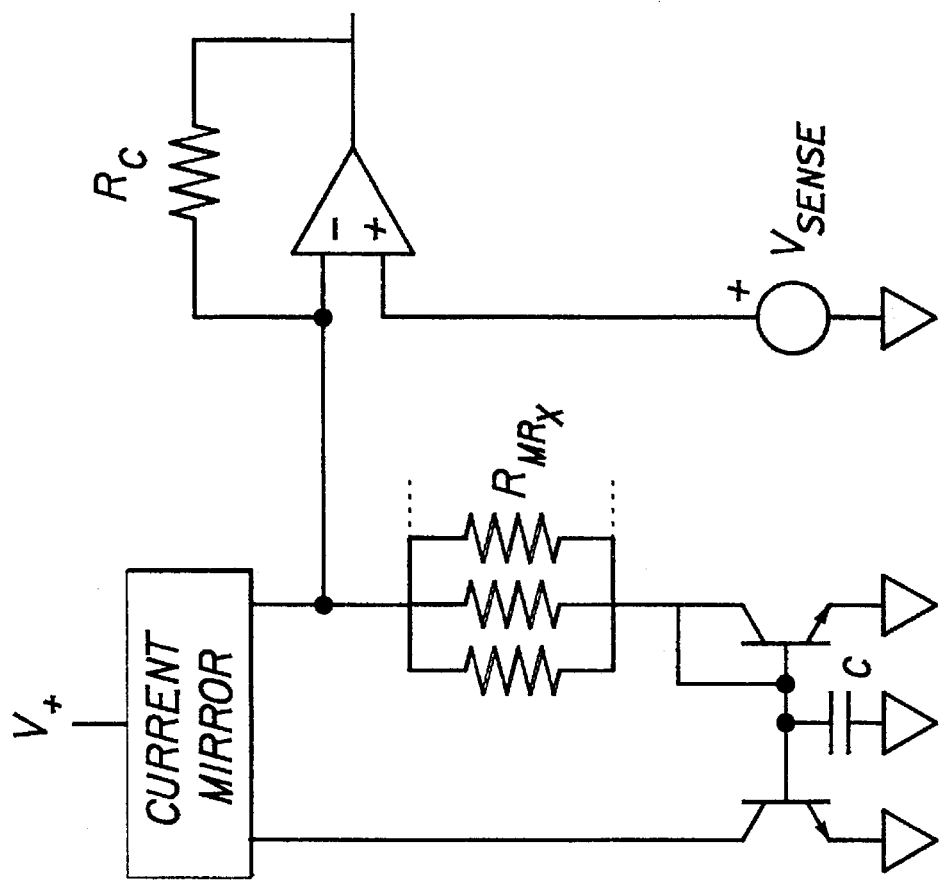
FIG. 4 is a circuit diagram of a MR apparatus which uses multiple sub-elements in conjunction with a current mirror in order to reduce further the voltage required to operate the apparatus.

Referring to FIGS. 2, 3 and 4, various summing circuits are shown from which transduction signals may be extracted from the summing of signals from sub-elements $MR_1$-$MR_x$. In each of FIGS. 2, 3 and 4, sub-elements $MR_1$-$MR_x$ are connected in parallel and biased with a constant bias voltage $V_{sense}$. Each example shows that the transduction signal $V_o$ is derived as the sum of the currents from each sub-element. In each case, the transduction signal $V_o$ is equal to the following:

$$V_0 = \frac{R_c I_0}{R_{SUB}} \sum_{x=1}^{n} \Delta R_{MR_x}$$

where $R_{sub}$ is the nominal biased resistance at each sub-element $MR_1$-$MR_x$, where $\Delta R_{MR}$ represents the change in nominal biased resistance due to the magnetoresistive response of each sub-element to sensed magnetic field signals, where x is the sub-element designation, where $R_c$ represents a gain setting resister, and where $I_o$ represents the current density flowing into and out of the MR element 20.

Referring specifically to FIG. 2, a basic one transistor common base paralleled amplifier is connected to the various sub-elements $MR_1$-$MR_x$. $V_{sense}$ is a standard constant voltage source which provides a constant voltage at the base of the transistor and, at normal bias current levels, a constant voltage at the emitter. $V_+$ is the power supply voltage. It must be large enough to provide for the voltage drops across $R_c$, $R_{MR_x}$ and the transistor. $R_c$ is a resistor connected to the collector of the transistor. It provides for the transduction of the current changes in $R_{MR_x}$ into voltage changes seen at $V_o$ on the output side of the rectifying coupling capacitor. This simple circuit provides both bias current and signal gain, but has the drawback that for small sense currents, the effective emitter resistance reduces the overall gain of the circuit.

Referring specifically to FIG. 3, the high gain of an operational amplifier is used to maintain constant gain at all sense currents as well as to eliminate the collector-to-emitter voltage ($V_{ce}$) needed to keep the transistor operating properly. As in FIG. 2, $V_{sense}$ is a standard voltage source, with feedback as shown around the operational amplifier of FIG.3. The operational amplifier adjusts its output voltage so that the inputs at the plus and minus terminals are the same. $V_{sense}$ applied to the plus terminal therefore causes the operational amplifier to adjust its output voltage to cause enough current to flow through $R_c$ and the parallel combination of $R_{MR_x}$ to produce $V_{sense}$ at the minus terminal. As $R_{MR_x}$ changes, $V_0$ will change to cause the plus terminal to remain at $V_{sense}$.

The circuit described in FIG. 4 has the further advantage of allowing even greater decreases in circuit voltage than the circuits described in FIGS. 2 and 3. A current mirror is used, and the value of C is chosen to filter out signal frequencies so that the current mirror reacts to D.C. and frequencies below the signal band.

The present invention can be used not only for the transduction of magnetic data, but also for the detection of magnetic fields (magnetometer), as an encoder for detecting shaft angles as a "currency" or security instrument (personal checks, traveler's checks, passports, immigration documents, ID cards, etc.), reader, magnetic material detector, and credit card reader.

What is claimed is:

1. A magnetic field sensing apparatus comprising:
   an elongated magnetoresistive (MR) element for sensing the magnetic field of a single magnetic track;
   a bias voltage source;
   a plurality of electrical contacts spaced at regular intervals in electrical contact with said elongated MR element to divide said MR element into at least three serially arrayed subelements; and connected to said plurality of electrical contacts,
   a circuit (1) for applying the same constant bias voltage from said bias voltage source across each subelement of said elongated MR element to produce a sense current in each said subelement, such that said subelements are electrically connected in parallel while arrayed spatially in series such that each subelement senses a different region across said track; and
   (2) for detecting a change in the sense current through each of said subelements of said MR element produced by a magnetic field of said single magnetic track and for summing said changes in sense current to produce a sum signal which is a function of said sensed magnetic field.

2. The magnetic field sensing apparatus of claim 1 wherein said magnetoresistive element is longer than 1000μ.

3. The magnetic field sensing apparatus of claim 1 wherein said apparatus is a magnetic field detector for detecting magnetic fields arising from magnetized security instrument in a security instrument detection device.

4. The magnetic field sensing apparatus of claim 1 wherein said magnetoresistive element is greater than 2000μ and less than 10,000μ (1 cm.) in length.

5. The magnetic field sensing apparatus of claim 1 wherein said magnetoresistive elements is longer than 10,000μ (1 cm).

6. The magnetic field sensing apparatus of claim 1 wherein said circuit includes a resistor connected to a power supply source, a constant bias voltage, a transistor having a base connected to said constant bias voltage, a collector connected to said resistor and an emitter connected to each of said subelements of said MR element, and a capacitor connected to said collector of said transistor, wherein said resistor and capacitor produce a voltage signal which is a function of said sum of changes in the sense currents through said subelements.

7. The magnetic field sensing apparatus of claim 1 wherein said circuit includes an operational amplifier having an inverting input, a noninverting input and an output, a constant bias voltage connected to said noninverting input of said operational amplifier, a resistor connected between said inverting input and said output of said operational amplifier and to each of said subelements of said MR element, and a capacitor connected to the output of said operational amplifier wherein a voltage signal is produced on said capacitor which is a function of said sum of changes in the sense currents through said subelements.

8. The magnetic field sensing apparatus of claim 1 wherein said circuit includes an operational amplifier having an inverting input, a noninverting input and an output, a current mirror connected to each of said subelements and to the inverting input of said operational amplifier, a constant bias voltage connected to the noninverting input of said operational amplifier and a resistor connected between the inverting input and the output of said operational amplifier, wherein a voltage signal is produced at the output of said operational amplifier which is a function of said sum of changes in the sense currents through said subelements.

9. The magnetic field sensing apparatus of claim 1 wherein said circuit is connected to said plurality of electrical contacts such that the sense current through each contact is opposite to that of its immediately neighboring contact(s) of said MR element.

* * * * *